(12) United States Patent
Nakagawa

(10) Patent No.: US 7,247,524 B2
(45) Date of Patent: Jul. 24, 2007

(54) MANUFACTURING METHOD OF WIRING SUBSTRATE

(75) Inventor: Kanae Nakagawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 50 days.

(21) Appl. No.: 11/169,007

(22) Filed: Jun. 29, 2005

(65) Prior Publication Data
US 2006/0216861 A1    Sep. 28, 2006

(30) Foreign Application Priority Data
Mar. 25, 2005  (JP)  ............................. 2005-089977

(51) Int. Cl.
*H01L 21/00*  (2006.01)
(52) U.S. Cl. .................... 438/118; 438/654
(58) Field of Classification Search ................ 438/118, 438/119, 622, 624, 644, 628, 654
See application file for complete search history.

(56) References Cited
U.S. PATENT DOCUMENTS

| | | | |
|---|---|---|---|
| 4,933,743 A * | 6/1990 | Thomas et al. ............. 257/742 |
| 6,300,242 B1 * | 10/2001 | Ueda et al. ................. 438/638 |
| 6,975,529 B2 * | 12/2005 | Yamanobe ................. 365/145 |
| 2004/0061155 A1 * | 4/2004 | Yamanobe ................. 257/295 |
| 2005/0104220 A1 * | 5/2005 | Tsuchiya et al. ........... 257/774 |
| 2006/0203458 A1 * | 9/2006 | Geissinger et al. ......... 361/763 |

OTHER PUBLICATIONS

Patent Abstracts of Japan, Publication No. 05029760 A, published on Feb. 5, 1993.
Patent Abstracts of Japan, Publication No. 2001009202 A, published on Jan. 16, 2001.
Patent Abstracts of Japan, Publication No. 2003309215 A, published on Oct. 31, 2003.

* cited by examiner

*Primary Examiner*—S. V. Clark
(74) *Attorney, Agent, or Firm*—Westerman, Hattori, Daniels & Adrian, LLP.

(57) ABSTRACT

After a first adhesive layer having high adhesion to a supporting base is locally formed, a second adhesive layer having low adhesion to the supporting base is formed all over the supporting base so as to cover the first adhesive layer. When a wiring structure is separated, a predetermined portion of the wiring structure where the first adhesive layer is formed is cut to thereby separate the integrated wiring structure and second adhesive layer from the first adhesive layer.

18 Claims, 10 Drawing Sheets

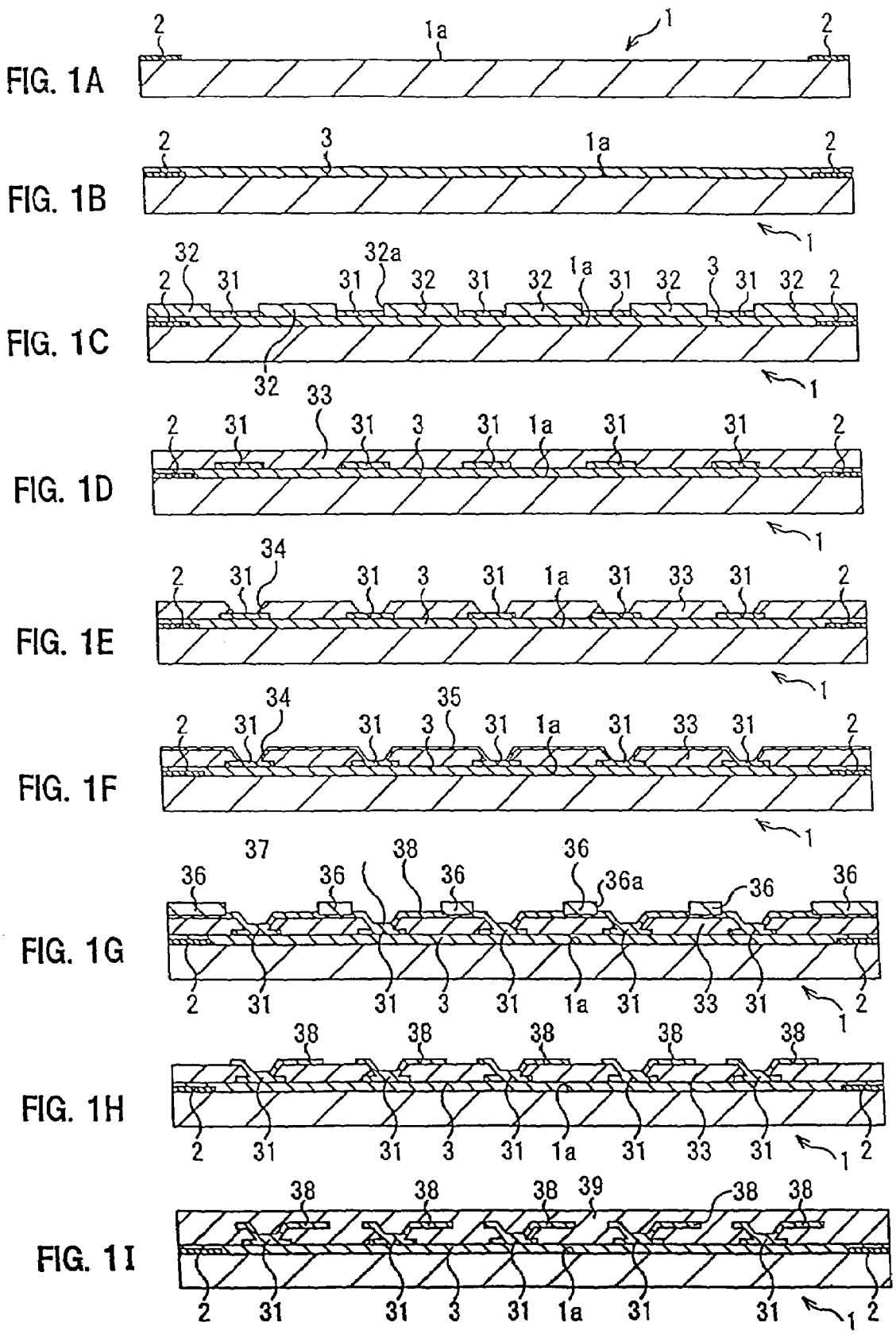

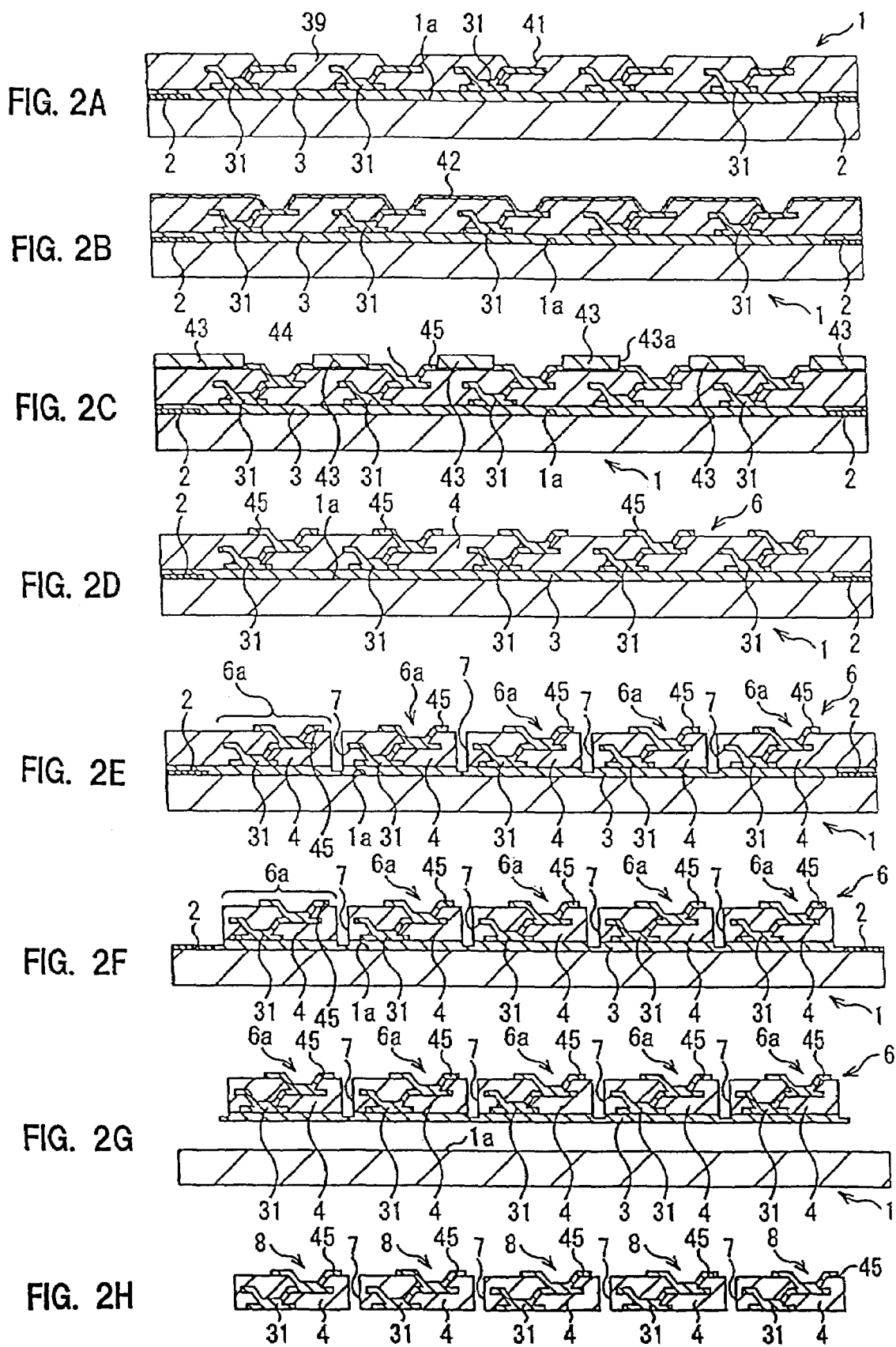

ONLY PERIPHERAL PORTION

DIAMETER DIRECTION

MESH

FORMATION OF CUT

ETCHING OF FIRST ADHESIVE LAYER

FORMATION OF CUT

ETCHING OF SECOND ADHESIVE LAYER

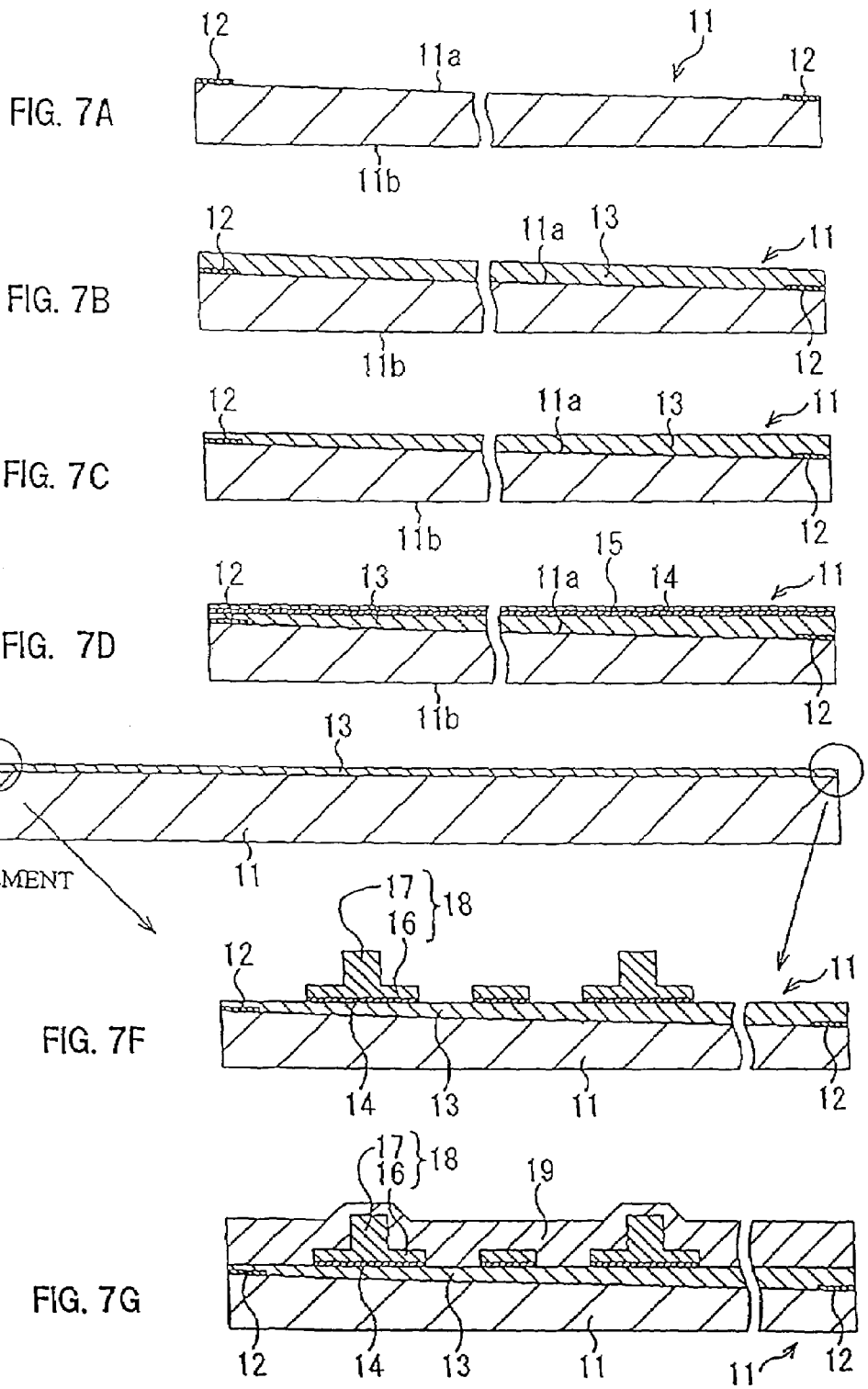

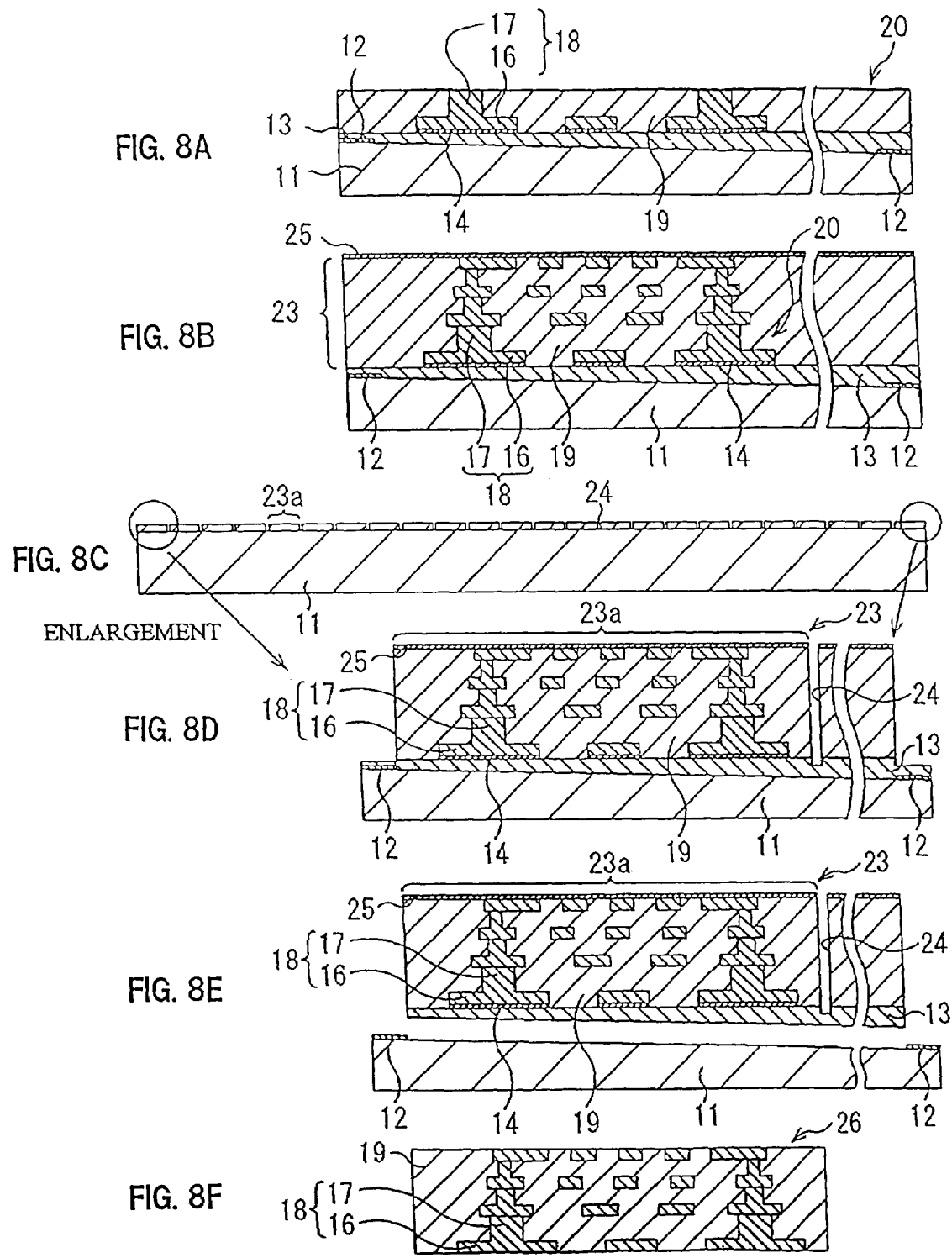

MANUFACTURING METHOD OF WIRING SUBSTRATE

CROSS-REFERENCE TO RELATED APPLICATIONS

This application is based upon and claims the benefit of priority from the prior Japanese Patent Application No. 2005-089977, filed on Mar. 25, 2005, the entire contents of which are incorporated herein by reference.

BACKGROUND OF THE INVENTION

1. Field of the Invention

The present invention relates to a manufacturing method of a wiring substrate, and particularly relates to a manufacturing method of forming a wiring structure on a supporting base and using the wiring structure as a wiring substrate. The present invention is suitable for application to manufacturing of a wiring substrate for an interposer used when a semiconductor element is mounted.

2. Description of the Related Art

In recent years, as means for realizing a function equal to that of a so-called SoC (System-on-Chip) equipped with an advanced system function on one semiconductor chip (element), a format called a so-called SiP (System-in-Package) attracts attention. This SiP realizes systematization by enclosing plural LSI chips in a single package and aims at finally realizing the function equal to that of the SoC at low cost.

The aforementioned SiP requires a wiring substrate containing high-density wirings in order to electrically connect plural LSI chips to each other and form a more downsized system. Generally, as this substrate, a ceramic wiring substrate, a printed substrate, a flexible substrate, a silicon substrate, or the like is used.

Out of the aforementioned wiring substrates, the flexible substrate is formed by forming a metal wiring layer on the surface of a resin film made of an organic insulator material and stacking these layers. This kind of substrate has excellent manufacturing performance in that it has flexibility. The silicon substrate needs to have through-holes to electrically connect its front and back surfaces although the finest wirings can be formed.

In the SiP which is used for portable equipment, such a wiring substrate is used a lot because of a demand for downsizing, weight reduction, and low cost. "ALIVH" (product name) manufactured by Matsushita Electric Industrial Co., Ltd. is an example of conventional wiring substrates. This "ALIVH" is realized by stacking plural substrates in each of which wirings and via holes filled with conductive paste are formed in an insulating resin.

This "ALIVH" has a problem that scaling down is difficult although low-cost manufacturing is possible, and moreover design flexibility is limited. To solve this problem and realize scaling down, low cost, and design flexibility at the same time, for example, it is effective to form a wiring structure on a supporting base made of silicon, separate the formed wiring structure, and use it as a wiring substrate.

(Patent Document 1)
Japanese Patent Application Laid-open No. 2001-9202
(Patent Document 2)
Japanese Patent Application Laid-open No. 2003-309215

In the aforementioned Patent Document 1 and Patent Document 2, methods of separating a wiring structure formed on a supporting base from the supporting base are disclosed, respectively.

In a technique disclosed in Patent Document 1, an adhesive layer having an opening which is a portion intended for formation of the wiring structure (a resin thin film multilayer circuit film) on the supporting base (a supporting substrate 11 in FIG. 4), and the wiring substrate is formed thereon. After an outer peripheral portion of the adhesive layer of the wiring structure is separated from an inner portion thereof on the supporting base, the wiring structure is stripped from the supporting base to form a wiring substrate (a flexible thin film multilayer circuit 21).

In the aforementioned method, however, in a final step, it is necessary to strip the wiring structure from the supporting base by applying ultrasonic waves or sticking an adhesive tape to the surface of the wiring structure, which may damage the wiring structure.

A technique disclosed in Patent Document 2 is a method of providing an etch-back layer (an etch-back layer 2) which has Cu as its main component and can be removed by etching between the supporting base (a base substrate 1 in FIG. 3) and the wiring structure (a multilayer wiring substrate 44) and separating the wiring structure from the supporting base by dissolving the etch-back layer by etching. In the aforementioned method, however, a long time is required until the etch-back layer 2 is completely etched to its inner portion, so that the possibility of causing a problem that a material composing the wiring structure is damaged or degenerated by an etching solution during etching or the like is high. Moreover, even if degeneration can be avoided, a problem that mass productivity in manufacturing is low still remains.

Incidentally, in addition to the aforementioned methods, among methods of separating the wiring structure from the supporting base is a method of using a silicon wafer as the supporting base and removing the silicon wafer itself by grinding and etching. Alternatively, it is also possible to use a metal plate made of aluminum or copper as the supporting base and remove aluminum or copper by etching.

In either of these methods, there is a disadvantage that the cost of the supporting base is reflected in manufacturing cost, in addition, an enormous amount of unnecessary dust is generated in a manufacturing process including a case where a residue left after the silicon wafer is ground becomes dust just as it is, so that an influence on the environment cannot be ignored.

Further, a method of forming the wiring structure, then thinning the supporting base by grinding it by a grinder or the like, and dissolving a thin film of the remaining supporting base by an acid or the like is also thought, but also in this method, a large amount of unnecessary dust is generated in the manufacturing process, and hence the aforementioned problem remains unsolved.

SUMMARY OF THE INVENTION

The present invention is made in view of the aforementioned problems and relates to a manufacturing method of a wiring substrate, and an object of the present invention is to provide a manufacturing method capable of easily separating the wiring substrate from a supporting base without causing damage and degeneration to the wiring substrate and further without generating dust.

Another object of the present invention is to manufacture a thin wiring substrate containing scaled-down wirings in an insulating layer at low cost.

A manufacturing method of a wiring substrate of the present invention comprises the steps of: forming a first adhesive layer having adhesion to a supporting base in a predetermined portion on one principal surface of the supporting base; forming a second adhesive layer having lower adhesion to the supporting base than the first adhesive layer on the supporting base so as to cover the first adhesive layer; forming a wiring structure, which is made by forming a wiring construction in an insulating layer, on the second adhesive layer; separating the first adhesive layer and the second adhesive layer in the predetermined portion; and separating the remaining second adhesive layer and the wiring structure as one piece from the supporting base.

Another aspect of a manufacturing method of a wiring substrate according to the present invention comprises the steps of: forming a first adhesive layer having adhesion to a supporting base in a predetermined portion on one principal surface of the supporting base; forming a second adhesive layer having lower adhesion to the supporting base than the first adhesive layer on the supporting base so as to cover the first adhesive layer; planarizing a surface of the second adhesive layer by cutting with a tool with the other principal surface of the supporting base as a reference; forming a wiring structure, which is made by forming a wiring construction in an insulating layer, on the planarized second adhesive layer; separating the first adhesive layer and the second adhesive layer in the predetermined portion; and separating the remaining second adhesive layer and the wiring structure as one piece from the supporting base.

BRIEF DESCRIPTION OF THE DRAWINGS

FIG. 1A to FIG. 1I are schematic sectional views showing a manufacturing method of a wiring substrate according to a first embodiment step by step;

FIG. 2A to FIG. 2H are schematic sectional views subsequent to FIG. 1A to FIG. 1I, showing the manufacturing method of the wiring substrate according to the first embodiment step by step;

FIG. 7A to FIG. 7G are schematic sectional views showing a manufacturing method of a wiring substrate according to a second embodiment step by step;

FIG. 8A to FIG. 8F are schematic sectional views subsequent to FIG. 7A to FIG. 7G, showing the manufacturing method of the wiring substrate according to the second embodiment step by step;

DETAILED DESCRIPTION OF THE PREFERRED EMBODIMENTS

Basic Gist of the Present Invention

Figure 3A:
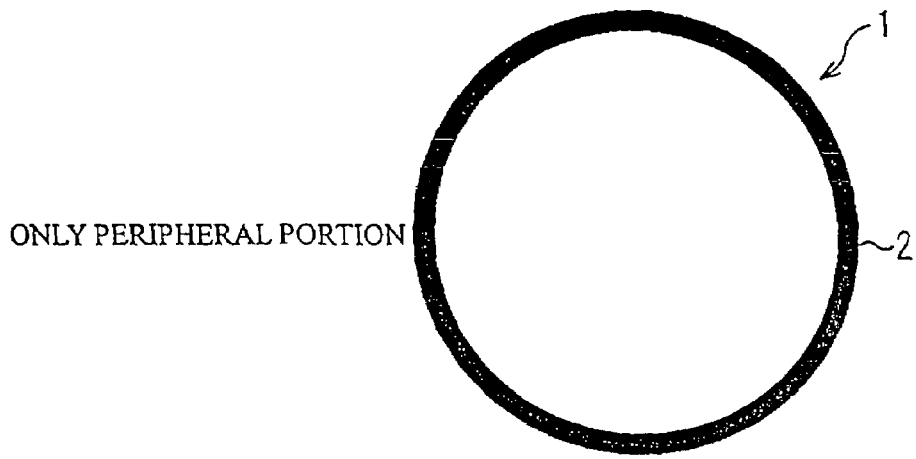
FIG. 3A to FIG. 3C are schematic plan views showing various forms of a second adhesive layer having low adhesion.

As a result of assiduous study for securing adhesion of a wiring structure to a supporting base when the wiring structure is formed on the supporting base and easily separating the wiring structure without causing damage and degeneration to the wiring structure when the wiring structure is separated from the supporting base, the present inventor comes up with the idea of, as an adhesive member to bond the wiring structure to the supporting base, using an adhesive member with a two-layer structure composed of a first adhesive layer having high adhesion to the supporting base and a second adhesive layer having lower adhesion to the supporting base than the first adhesive layer. Namely, when the wiring structure is formed, the adhesion of the wiring structure to the supporting base is secured by the first adhesive layer which is locally provided on the supporting base, and when the wiring structure is separated, bonding of the wiring structure to the first adhesive layer is released, and using the low adhesion of the second adhesive layer to the supporting base, the wiring structure is easily separated integrally with the second adhesive layer from the supporting base.

As the supporting base, a silicon wafer, a glass substrate, a ceramic substrate, or the like can be used. When the large-sized supporting base is used, variations in the thickness of the supporting base sometimes exert a large influence on the formation of the wiring structure.

Hence, in the present invention, after the second adhesive layer is formed on one principal surface (front surface) of the supporting base on which a wiring substrate is mounted, the surface of the second adhesive layer is planarized by a cutting method with a tool with the other principal surface (back surface) of the supporting base as a reference.

This cutting method is different from a grinding method in which adhesion of grinding dust becomes a problem, a polishing method in which occurrence of level difference called dishing in a polished surface becomes a problem, or the like, and enables elaborate planarization easily and at high speed without the adhesion of the cutting dust to the surface and occurrence of level difference. Metal such as Cu, Al, or Ni and an insulating material such as polyimide are materials capable of being easily cut by a tool, and by using the cutting method, both the metal and the insulating material can be continuously planarized easily and at high speed.

By this planarization processing, so to speak, variations in the thickness of the supporting base are accommodated by the second adhesive layer, the surface of the second adhesive layer is made a flat surface without any variation in thickness with respect to the back surface reference, and hence in subsequent steps, the wiring structure can be formed to have an exact predetermined thickness without consideration given to variations in thickness. This cutting method is applicable to planarization when wirings of the wiring structure are formed, and the surfaces of wirings and an insulating layer can be made a continuous high-precision flat surface.

Here, considering that in view of the fact that the supporting base used in the present invention is applied again to the present invention, the surface of the supporting base should not be damaged by cutting and when a silicon wafer, a hard ceramic substrate, or the like is used as the supporting base, a tool used for cutting should not be damaged, it is desirable that the second adhesive layer be formed to have a thickness equal to or more than a maximum value of variations in the thickness of the supporting base, that is, a total thickness variation (TTV) of the supporting base.

Specific Embodiments to Which the Present Invention is Applied

Specific embodiments to which the present invention is applied will be described in detail below with reference to the drawings.

(First Embodiment)

FIG. 1A to FIG. 1I and FIG. 2A to 2H are schematic sectional views showing a manufacturing method of a wiring substrate according to the first embodiment step by step.

First, a second adhesive layer 2 is selectively formed in a predetermined portion on one principal surface of a supporting base 1.

As shown in FIG. 1A, the first adhesive layer 2 is selectively formed in the predetermined portion on a front surface 1a of the supporting base 1a.

Here, the supporting base 1 is, for example, a silicon (Si) wafer. A material having high adhesion to the supporting base 1 is necessary as the first adhesive layer 2, and Chromium (Cr) is used in this embodiment although Cr or titanium (Ti) is applicable. This first adhesive layer 2 is formed by forming a Cr film (not shown) with a thickness of approximately 100 nm on the one principal surface 1a of the supporting base 1 by a sputtering method and selectively removing the Cr film by photolithography and subsequently by dry etching.

Figure 3B:
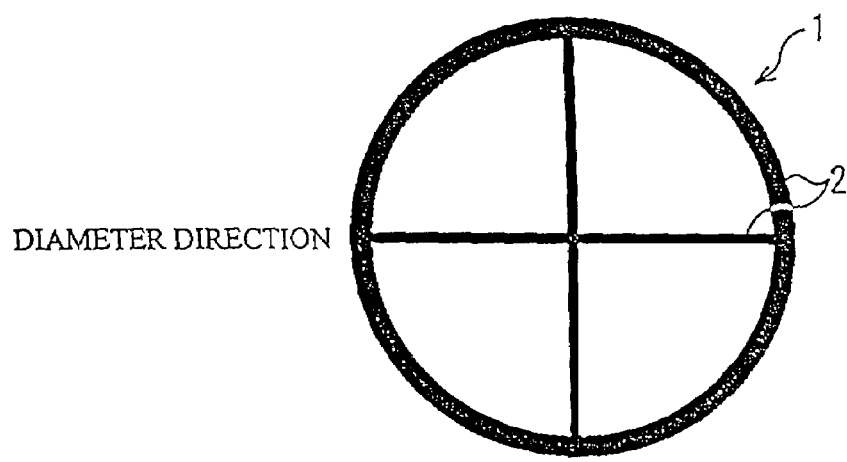
Figure 3C:
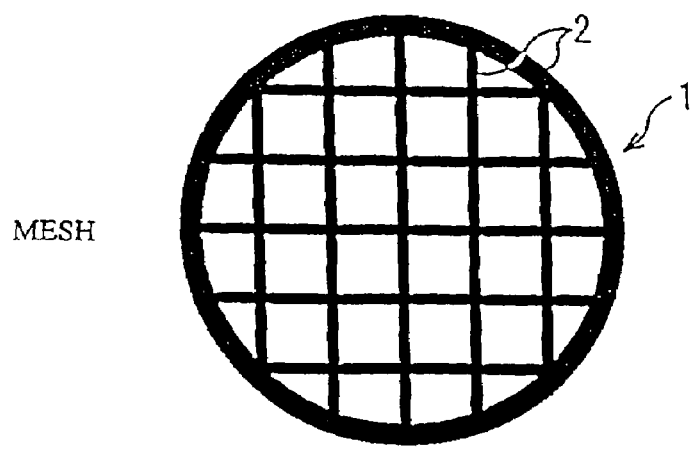

Incidentally, the aforementioned predetermined portion is at least a peripheral edge portion of the supporting base 1 as shown in FIG. 3A, but additionally, to secure stronger adhesion to the supporting base 1 when the wiring structure is formed, as shown in FIG. 3B, plural first adhesive layers 2 (here, two adhesive layers which are almost orthogonal to each other through the center) may be provided on the principal surface of the supporting base 1. Alternatively, as shown in FIG. 3C, the first adhesive layer 2 may be provided in a mesh pattern on the one principal surface 1a of the supporting base 1.

Then, as shown in FIG. 1B, a second adhesive layer 3 is provided to cover the first adhesive layer 2 on the one principal surface 1a of the supporting base 1. The second adhesive layer 3 is formed to have a thickness of approximately 5 μm on the one principal surface 1a of the supporting base 1 by the sputtering method or a plating method.

As a material for the second adhesive layer 3, a material which satisfies the following conditions (1) and (2) is desirable.

(1) Its adhesion to the supporting base 1 is lower than that of the first adhesive layer 2.

(2) It has ease of wet etching, and is excellent in heat resistance, resistance to stress damage, ease of cutting, and so on when the wiring structure located on the second adhesive layer 3 is formed.

When the supporting base 1 is the silicon wafer, as a material which satisfies the condition (1), nickel (Ni), copper (Cu), or aluminum (Al) having high adhesion to silicon is usable. As a material which satisfies the condition (2), metal is suitable, and especially Ni or Cu is usable considering the fact that the thickness thereof can be easily obtained by the plating method or the like. From the above, as the material for the second adhesive layer 3, Ni, Cu, or Al is preferable, and Ni or Cu is more preferable. In this embodiment, Ni is used.

Further, the second adhesive layer 3 needs to have high adhesion to a wiring structure 6 described later. If the adhesion between the wiring structure 6 and the second adhesive layer 3 is low, there is a possibility that the wiring structure 6 is stripped off or a swelling, wrinkles, or the like of the wiring structure occurs during a manufacturing process.

When the high adhesion between the second adhesive layer 3 and the wiring structure 6 is secured, the relation with an insulating material which composes the wiring structure 6 is important, and if the insulating material is polyimide or the like described later, high adhesion to N, Cu, or the like can be obtained.

Incidentally, although it is desirable to planarize the surface of the second adhesive layer 3 after the second adhesive layer 3 is formed, this planarization step will be described in detail in a second embodiment.

Subsequently, the wiring structure 6 is formed on the one principal surface 1a of the supporting base 1 with the second adhesive layer 3 therebetween through manufacturing steps shown in FIG. 1C to FIG. 1I and FIG. 2A to FIG. 2D.

First, as shown in FIG. 1C, first-layer wirings 31 are formed on the second adhesive layer 3.

A resist material (not shown) is applied onto the surface of the second adhesive layer 3, and the resist material is fabricated in a pattern to selectively form a resist layer 32.

This resist layer 32 defines openings 32a to expose the surface of the second adhesive layer 3, for example, in a long rectangular shape corresponding to the formed wiring pattern. The first-layer wirings 31 are formed in the openings 32a by Cu plating to have a thickness of approximately 3 μm using the Ni layer 3 exposed in each of the openings 32a as a plating seed layer.

Then, after the resist layer 32 is removed using a stripping solution, as shown in FIG. 1D, an insulating layer 33 which covers the first-layer wirings 31 is formed. This insulating layer 33 is formed by applying polyimide (product name PI 2611 manufactured by HD MicroSystems, Ltd.) to such a degree that the wirings 31 on the second adhesive layer 3 are covered. This insulating layer 33 is formed to have a thickness of approximately 10 μm.

Thereafter, as shown in FIG. 1E, via holes 34 for inter-layer connection are formed in the insulating layer 33.

The via holes 34 are selectively provided corresponding to the wirings 31. These via holes 34 are formed by selectively irradiating a laser beam to the insulating layer 33, for example, using a UV-YAG laser (a drilling system manufactured by ESI Corporation, oscillation frequency: 20 kHz). As a result, part of the surface of each of the wirings 31 is exposed.

Then, as shown in FIG. 1F, a plating seed layer 35 which extends from the exposed surfaces of the wirings 31 to the surface of the insulating layer 33 is formed.

A Cr layer with a thickness of 80 nm is formed on the surfaces of the wirings 31 exposed in the via holes 34 and the surface of the insulating layer 33, and a Cu film with a thickness of 500 nm is formed on the Cr layer by the sputtering method. These Cu layer and Cr layer compose the plating seed layer 35.

Subsequently, as shown in FIG. 1G, connection vias 37 of the wirings 31 and land wirings 38 are formed.

A resist layer (not shown) is applied onto the plating seed layer 35, and by fabricating the resist layer in a pattern, a resist layer 36 is selectively formed. The resist layer 36 defines openings 36a to expose wiring forming portions of the plating seed layer 35.

Thereafter, the surface of the plating seed layer 35 exposed in each of the openings 36a is plated with Cu. By this Cu plating, in the via hole 34, the connection via 37 which is electrically connected to the wiring 31 and the wiring 38 which extends integrally with the connection via 37 onto the insulating layer 33 are formed.

Then, as shown in FIG. 1H, the resist layer 36 and the plating seed layer 35 located thereunder are removed.

After the resist layer 36 is removed by the stripping solution, the plating seed layer 35 located under the resist layer 36 is removed by wet etching. As an etching solution, concerning Cu, an acid ammonium persulfate aqueous solution can be used, and concerning Cr, an alkaline potassium ferricyanide aqueous solution can be used.

Subsequently, as shown in FIG. 1I, an insulating layer 39 which covers the connection vias 37 and the land wires 38 is formed.

On this occasion, before the formation of the insulating layer 39, the insulating layer 33 is subjected to oxygen plasma treatment to thereby remove a substance which inhibits insulating properties of the insulating layer 33 and recover the insulating properties.

In the step of forming the connection vias 37 and/or in the step of forming the wirings 38, the substance which inhibits the insulating properties is sometimes formed on the surface of the insulating layer 33 due to the influence of a treatment solution or the like, and hence this substance is removed by the oxygen plasma treatment. Thereafter, the insulating layer 39 which covers the connection vias 37 and the wirings 38 and is made of polyimide is formed to have a thickness of approximately 10 µm.

Then, as shown in FIG. 2A, via holes 41 for interlayer connection are formed in the insulating layer 39.

In the same manner as the aforementioned via holes 34, the via holes 41 are formed, for example, by selectively irradiating the UV-YAG laser to the insulating layer 39. As a result, part of the surface of each of the wirings 38 is exposed.

Subsequently, as shown in FIG. 2B, a plating seed layer 42 is formed.

A Cr layer with a thickness of 80 nm is formed on the surfaces of the wirings 38 exposed in the via holes 41 and the surface of the insulating layer 39, and a Cu film with a thickness of 500 nm is formed on the Cr layer by the sputtering method. These Cu layer and Cr layer compose the plating seed layer 42.

Subsequently, as shown in FIG. 2C, connection vias 44 of the wirings 38 and second-layer wirings 45 are formed.

A resist layer (not shown) is applied onto the plating seed layer 42, and by fabricating the resist layer in a pattern, a resist layer 43 is selectively formed. The resist layer 43 defines openings 43a to expose wiring forming portions of the plating seed layer 42.

Thereafter, the surface of the plating seed layer 42 exposed in each of the openings 43a is plated with Cu. By this Cu plating, in the via hole 41, the connection via 44 which is electrically connected to the wiring 38 and the wiring 45 which extends integrally with the connection via 44 onto the insulating layer 39 are formed.

Then, as shown in FIG. 2D, the resist layer 43 and the plating seed layer 42 located thereunder are removed.

After the resist layer 43 is removed by the stripping solution, the remaining plating seed layer 42 is removed by wet etching. As an etching solution, concerning Cu, the acid ammonium persulfate aqueous solution is used, and concerning Cr, the alkaline potassium ferricyanide aqueous solution is used.

The insulating layer 39 is subjected to the oxygen plasma treatment to thereby repair damage which the insulating layer 39 has received in the step of forming the connection vias 44, the wirings 45, and so on, and recover the insulating properties of the insulating layer 39.

Through the aforementioned steps, the wiring structure 6 is formed on the second adhesive layer 3 in a state of being bonded to the second adhesive layer 3. This wiring structure 6 is wiring layers which are constructed by forming the lower wirings 31 in the insulating layer 33 and the upper wirings 45 on the insulating layer 39, respectively. Incidentally, the wiring layer formed in the wiring structure 6 through the aforementioned steps is a wiring layer in a thin-film form, but the thin-film form is not indispensable, and other forms are also possible.

In FIG. 2D to FIG. 2H, the insulating layers 33 and 39 are stacked films made of the same material, so that the insulating layers 33 and 39 are regarded as one piece and represented by an insulating layer 4.

Incidentally, although the case where two wiring layers are stacked as the wiring structure 6 is shown in this embodiment, it is naturally possible to adopt a multilayer structure with three or more wiring layers as required.

Here, the adhesion of the second adhesive layer 3 to the supporting base 1 is low, and the adhesion thereof to the wiring structure 6 is high. On the other hand, the adhesion of the first adhesive layer 2 to the supporting base 1 and the second adhesive layer 3 is extremely high. Accordingly, when the wiring structure 6 and the second adhesive layer 2 are seen as one-piece structure, this one-piece structure is more strongly bonded to the supporting base 1 by the first adhesive layer 2.

Incidentally, when the wiring structure 6 is formed, it is desirable to planarize the surfaces of the insulating layer 4 and the wirings 5 layer by layer and stack them, but this planarization step will be described in detail in the second embodiment described later.

Then, as shown in FIG. 2E, cuts which reach the second adhesive layer 3 are formed in the wiring structure 6 so as to correspond to and demarcate chip regions 6a.

Dicing lines (cuts in a grid pattern) 7 which reach the second adhesive layer 3 are formed between the adjacent chip regions 6a of the wiring structure 6 using a dicing blade (a blade manufactured by massing diamond abrasive grains or the like with resin or metal such as aluminum and used for dicing).

Figure 4:
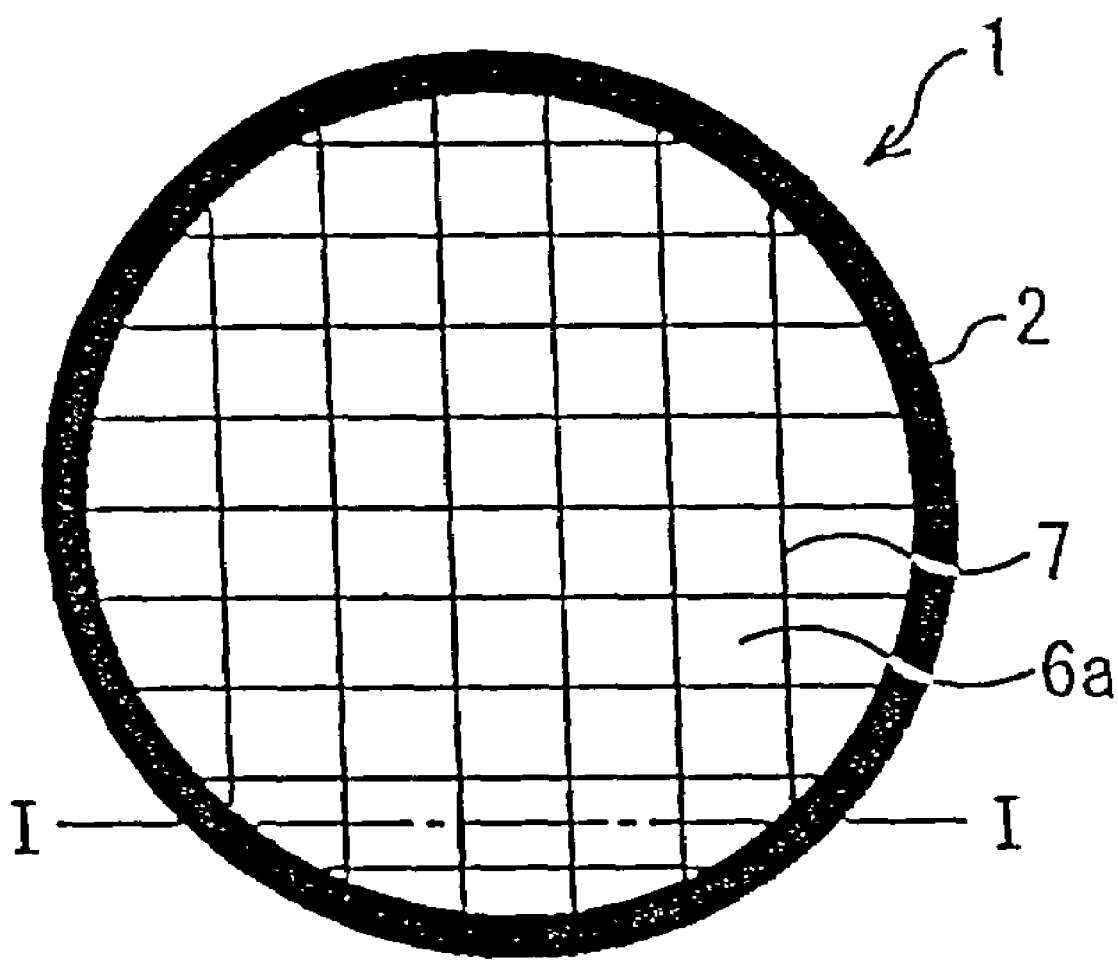
FIG. 4 is a schematic plan view showing dicing lines formed in a wiring structure.

An example in which the dicing lines 7 are formed in the wiring structure is shown in FIG. 4. A section taken along the line I—I in FIG. 4 corresponds to FIG. 2E. For convenience of illustration, a state in which a relatively small number of chip regions 6a are demarcated on the supporting base 1 is shown as the example, but in actual manufacturing process, many chip regions 6a are demarcated.

Subsequently, as shown in FIG. 2F, the second adhesive layer in the predetermined portion (the portion where the first adhesive layer is formed) is removed by cutting.

In the aforementioned predetermined portion, that is, the peripheral edge portion (both end portions in the example shown) of a formation shown in FIG. 2E, the wiring structure 6 and the second adhesive layer 3 are cut and removed by a tool to thereby expose the surface of the first adhesive layer 2.

This cutting and a cutting apparatus used therefor will be described in detail in the second embodiment.

If the supporting base 1 is the silicon wafer and the outer edge thereof has a nearly circular shape as in this embodiment, cutting is suitable for the removal of the predetermined portion, but if the supporting base has a rectangular shape, it is diced using the blade in the same manner as the formation of the dicing lines 7. Incidentally, the sequence of the dicing step shown in FIG. 2E and the cutting step shown in FIG. 2F may be altered.

Thereafter, as shown in FIG. 2G, a formation in which the wiring structure 6 and the second adhesive layer 3 are integrated is separated from the supporting base 1.

The formation shown in FIG. 2F is immersed in an etching solution to thereby remove the first adhesive layer 2 by dissolution by wet etching. The etching solution used here is an etching solution, for example, the alkaline potassium ferricyanide, for Cr as the material for the first adhesive layer 2.

As a result of the removal of the first adhesive layer 2, the wiring structure 6 comes to exist on the supporting base 1 with only the second adhesive layer 3 therebetween.

Since the second adhesive layer 3 has high adhesion to the wiring structure 6 but low adhesion to the supporting base 1, the wiring structure 6 is separated integrally with the second adhesive layer 3 from the supporting base 1 without receiving damage caused by being stripped from the supporting base 1 or a bad influence such as degeneration caused by being brought into contact with (being immersed in) the etching solution.

On this occasion, since the wiring structure 6 has flexibility, it does not suffer any disadvantage such as breakage due to stress applied at the time of separation.

Then, as shown in FIG. 2H, the second adhesive layer 3 is removed from the wiring structure 6.

The second adhesive layer 3 is removed by dissolution from the wiring structure 6 by wet etching. As an etching solution, an etching solution (for example, Top Rip manufactured by Okuno Chemical Industries Co., Ltd.) for Ni as the material for the second adhesive layer 3 is used. On this occasion, the dicing lines 7 are formed between the respective chip regions 6a of the wiring structure 6, and therefore, after the second adhesive layer 3 is dissolved, the wiring structure 6 is separated into individual chip-shaped wiring substrates 8.

Incidentally, when an LSI chip or the like is mounted on the wiring substrate 8, the LSI chips or the like may be mounted after the wiring substrates 8 are individually separated (namely, after the aforementioned step in FIG. 2H), or the LSI chips or the like may be mounted on the wiring structure 6 before the wiring structure 6 is separated from the supporting base 1 (namely, before the aforementioned step in FIG. 2E).

The method of mounting the LSI chips or the like before the wiring structure 6 is separated from the supporting base 1 has a merit in terms of manufacturing efficiency.

Further, in the aforementioned step in FIG. 2F, it is desirable to change modes of cutting and wet etching according to the thickness of the first adhesive layer 2 in the cutting processing when the peripheral edge portion of the formation shown in FIG. 2E is removed. More specifically, there are two methods described below.

Figure 5A:
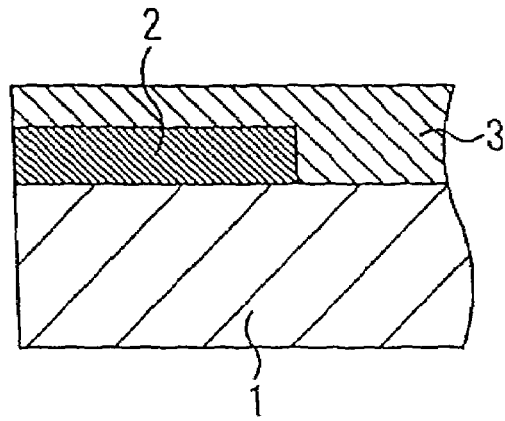
FIG. 5A to FIG. 5C are schematic sectional views partially showing an example when the wiring structure is separated from the supporting base in an enlarged form.
Figure 5B:
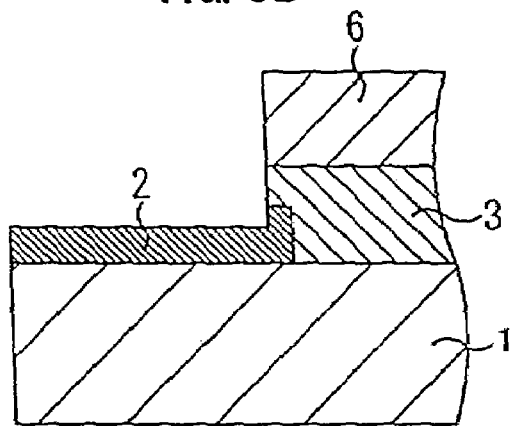
Figure 5C:
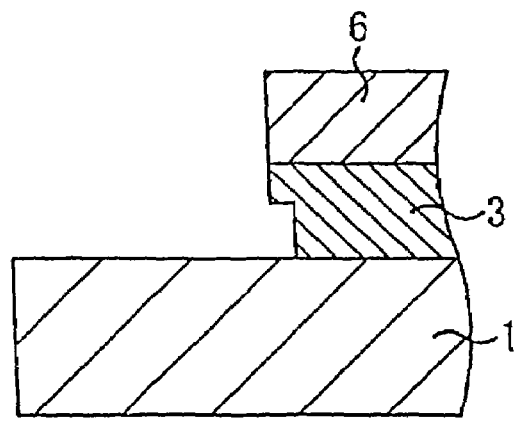

The first removal method is applied to a case when the first adhesive layer 2 is relatively thick to such a degree that its surface portion can be selectively cut (namely, its lower portion can be left after cutting) as shown in FIG. 5A to FIG. 5C.

Namely, as shown in FIG. 5B, surface portions of the second adhesive layer 3 and the first adhesive layer 2 are subjected to cutting subsequent to the cutting of the wiring structure 6. Thereafter, by subjecting the first adhesive layer 2 to wet etching capable of removing only the first adhesive layer, the remaining first adhesive layer 2 is removed by dissolution as shown in FIG. 5C.

Figure 6A:
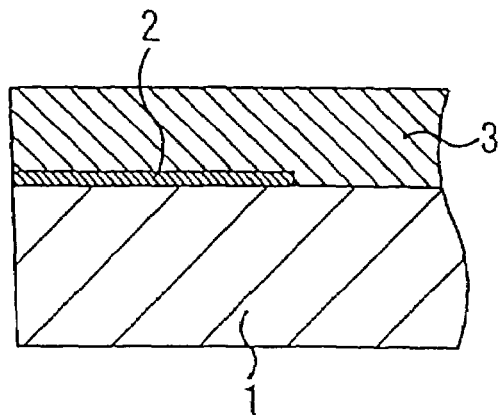
FIG. 6A to FIG. 6C are schematic sectional views partially showing another example when the wiring structure is separated from the supporting base in an enlarged form.

The second removal method is applied to a case where the first adhesive layer 2 is relatively thin as shown in FIG. 6A.

Figure 6B:
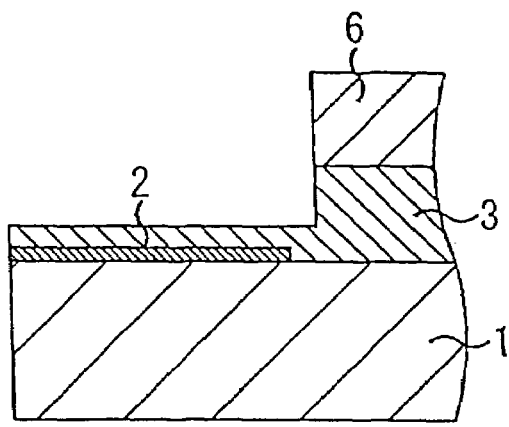

In this method, first, as shown in FIG. 6B, cutting is continued subsequent to the cutting of the wiring structure 6, but the cutting is performed in such a manner that part of the second adhesive layer 3 remains. At this time, the width of a portion removed by cutting is wider than the width of the first adhesive layer 2.

Figure 6C:
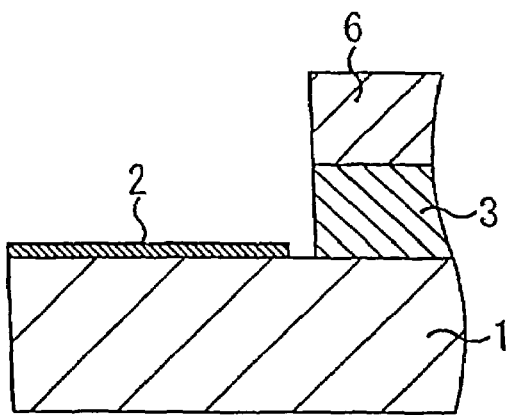

Thereafter, the second adhesive layer 3 is subjected to wet etching for removing only the second adhesive layer, and as shown in FIG. 6C, the second adhesive layer 3 remaining in the predetermined portion including a portion on the first adhesive layer 2 is removed by dissolution.

Consequently, on the supporting base 1, the first adhesive layer 2 remains independently of and apart from the one-piece structure of the second adhesive layer 3 and the wiring structure 6, but it does not become an obstacle to the separation of the wiring structure 6. In the second removal method, an area wider than the first adhesive layer 2 is subjected to cutting, so that cutting accuracy can be set lower compared with the first removal method.

According to this embodiment, it is possible to easily and certainly separate the wiring structure 6 from the supporting base 1 without causing damage and/or degeneration to the wiring structure 6 and further without nearly generating dust. Accordingly, the thin wiring substrate 8 containing the scaled-down wiring 5 in the insulating layer 4 can be easily and inexpensively manufactured.

(Second Embodiment)

Next, the second embodiment will be described. This embodiment discloses a manufacturing method of a wiring substrate in almost the same manner as in the first embodiment, but is different from the first embodiment in two respects: that the second adhesive layer having low adhesion is planarized and that the formation of the wiring structure with a multilayer wiring structure is specifically added.

FIG. 7A to FIG. 7G and FIG. 8A to FIG. 8F are schematic sectional views showing the manufacturing method of the wiring substrate according to this embodiment step by step. In figures except FIG. 7E, FIG. 8C, and FIG. 8F, to make the explanation easy to understand, the difference in thickness between right and left end portions of a supporting base 11 is emphasized.

As shown in FIG. 7A, a first adhesive layer 12 is selectively formed in a predetermined portion on the supporting base 11.

The first adhesive layer 12 is pattern-formed on a predetermined portion of one principal surface 11a of the supporting base 11. The supporting base 11 is, for example, a silicon wafer with a diameter of eight inches and a TTV of approximately 3 μm, and the first adhesive layer 12 is made of a material such as Cr, Ti, or the like with high adhesion to the supporting base 11. In this embodiment, Cr is used as a material for the first adhesive layer 12.

More specifically, a Cr thin film (not shown) is formed to have a thickness of approximately 100 nm on the one principal surface 11a of the supporting base 11 by the sputtering method or the plating method, and after the principal surface 11a of the supporting base 11 is cleaned, for example, by Ar plasma for approximately twenty minutes, the Cr film is selectively removed by lithography and then by dry etching and thereby the Cr film is left in a band shape in the predetermined portion.

This predetermined portion is a peripheral edge portion of the one principal surface 11a of the supporting base 11 with a width from 2 mm to 10 mm, more preferably a width of approximately 3 mm, and as a result the first adhesive layer 12 has a planar ring shape. Thereafter, a resist used to selectively form the first adhesive layer 12 is removed with a resist stripping solution. Incidentally, if necessary, ashing with $O_2$ plasma may be further performed.

Subsequently, as shown in FIG. 7B, a second adhesive layer 13 is formed on the one principal surface 11a of the supporting base 11.

The second adhesive layer 13 is formed on the one principal surface 11a of the supporting base 11 so as to cover the first adhesive layer 12. As a material for the second adhesive layer 13, Cu is used in this embodiment for the same reason as in the first embodiment.

When the thickness of the second adhesive layer 13 is equal to or less than the TTV of the supporting base 11, part of the surface of the supporting base 11 becomes exposed when the second adhesive layer 13 is formed all over the one principal surface of the supporting base 11, which causes a problem that the wiring structure does not function.

Hence, in this embodiment, the second adhesive layer 13 is formed so as to be able to accommodate the TTV of the supporting base 11 when the surface thereof is planarized by cutting described later, that is, so as to have a thickness exceeding the value of the TTV. In this embodiment, after a Cu thin film with a thickness of approximately 100 nm is formed by the sputtering method, Cu with a thickness of not less than 3 µm which is the TTV of the supporting base 11, here with a thickness of approximately 5 µm is deposited by the plating method to thereby form the second adhesive layer 13.

Then, as shown in FIG. 7C, the surface of the second adhesive layer 13 is planarized.

In this planarization step, while the supporting base 11 is fixed on a rotary table of a cutting apparatus, the surface of the second adhesive layer 13 is planarized by cutting using a hard tool made of diamond or the like.

Figure 9:
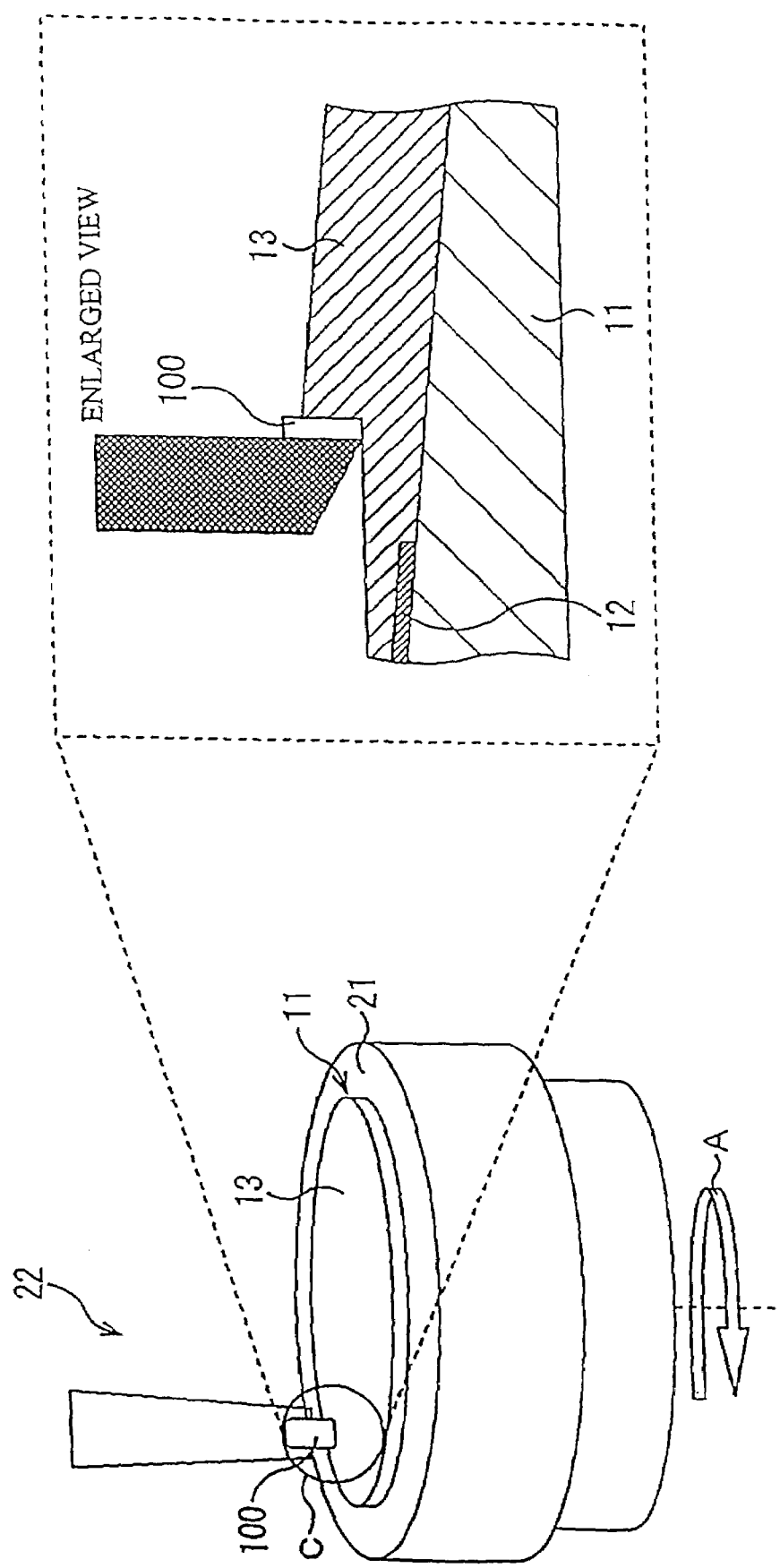
FIG. 9 is a schematic view showing an example of a cutting apparatus.

FIG. 9 shows an example of the cutting apparatus used when the aforementioned cutting is performed. This cutting apparatus is a so-called ultra-precision lathe and includes a rotary support (rotary table) 21 which fixes an object to be processed such as the supporting base 11 by vacuum suction and rotates the object to be processed at a predetermined rotation speed (for example, at the number of revolutions approximately between 800 rpm and 1600 rpm). This rotary support 21 is rotationally driven, for example, in a direction shown by the arrow A in FIG. 9.

This cutting apparatus includes a hard tool 100 made of diamond or the like and a tool drive part 22 which drives the tool 100 from a periphery of the object to be processed such as the supporting base 11 toward a rotation center.

At the time of cutting, cutting is performed by moving the tool 100 from the periphery of the supporting base 11 to the rotation center while the supporting base 11 is being rotated in the direction shown by the arrow A with the tool 100 abutting on the surface of the rotating supporting base 11. An enlarged view of the circle C which shows a state of cutting in the step in FIG. 7C is shown on the right side of FIG. 9, and here a cutting part 22 is viewed from the left side.

The case where the ultra-precision lathe is used is shown as an example in this cutting, but it is also possible to fix the object to be processed and machine it by a miller in which a tool is rotationally moved.

In the cutting step in this embodiment, the supporting base 11 is fixed on the rotary table 21 while the other principal surface, that is, a back surface 11b of the supporting base 11 is closely attached to the rotary table 21 (namely, with the back surface 11b as a reference). In this fixed state, variations in the thickness, that is, TTV of the supporting base 11 is reflected in the surface of the second adhesive layer 13.

Here, the TTV of the supporting base 11 is accommodated by the thickness of the second adhesive layer 13.

As an example, a case where the supporting base 11 has a TTV of 3 µm is assumed. If the second adhesive layer is formed with a thickness of approximately 5 µm uniformly on the supporting base 11 on this occasion, the supporting base 11 on which the second adhesive layer is formed comes to have the TTV of 3 µm similarly to the supporting base 11 itself. When a surface layer portion of the second adhesive layer 13 is cut at a setting such that the most recessed portion is cut by 1 µm in this state, the second adhesive layer 13 comes to have a thickness of (5 µm−1 µm=) 4 µm in a portion with a maximum thickness and have a thickness of (5 µm−3 µm−1 µm=) 1 µm in a portion with a minimum thickness. In such a state, the surface of the adhesive layer 13 is planarized (with the back surface 11b of the supporting base 11 as a reference). As just described, the TTV of the supporting base 11 is accommodated by the thickness of the second adhesive layer 13.

Incidentally, the surface of the second adhesive layer after the aforementioned cutting should be a flat surface whose TTV is zero in calculation, but actually the cutting accuracy of the cutting apparatus exists, so that the surface of the second adhesive layer has irregularities equal to the cutting accuracy of the cutting apparatus. Namely, the supporting base 11 on which the second adhesive layer is formed has a value of TTV equal to the cutting accuracy of the cutting apparatus. Incidentally, in this embodiment, the cutting accuracy of the cutting apparatus is a value smaller than 1 µm.

Consequently, in subsequent manufacturing steps, without consideration given to the TTV of the supporting base 11, the wiring structure with an exact thickness can be formed. Namely, the second adhesive layer 13 functions as a layer to accommodate the TTV as well as a layer to separate the wiring structure from the supporting base 11.

Then, as shown in FIG. 7D, a Cr layer 14 with a thickness of approximately 100 nm which becomes a barrier layer at the time of separation of the wiring structure, and a Cu layer 15 with a thickness of approximately 100 nm which becomes a seed layer for plating are stacked in sequence, respectively, by the sputtering method.

Thereafter, as shown in FIG. 7D to FIG. 7G, FIG. 8A, and FIG. 8B, a wiring structure 23 is formed on the second adhesive layer 13.

The overall construction of a formation shown in FIG. 7D is, for example, as shown in FIG. 7E.

FIG. 7E shows only the supporting base 11 and the first adhesive layer 13 for convenience of illustration.

FIG. 7F, FIG. 7G, FIG. 8A, and FIG. 8B each show, in an enlarged form, the construction of the supporting base 11 in both end portions (in circles) shown in FIG. 7E, but the following explanation will be particularly directed to the construction thereof in a left end portion.

First, as shown in FIG. 7F, a wiring pattern 18 in a lowest layer of the wiring structure 23 is formed.

This wiring pattern 18 is formed by Cu wirings 16 and Cu via posts 17 on the surface of the second adhesive layer 13.

After a resist pattern (not shown) having wiring-shaped openings is first formed on the Cu layer 15 by lithography, Cu is embedded in the wiring-shaped openings by the plating method. Then, the resist pattern is removed by a resist stripping solution.

Further, a resist residue is removed by ashing using $O_2$ plasma if necessary, and the Cu wirings 16 are formed.

Then, a resist layer (not shown) containing portions on the Cu wirings 16 is formed, and a resist pattern (not shown) for forming Cu via posts is formed by lithography processing. In this resist pattern, openings corresponding to the via posts are provided on the Cu wirings 16 electrically connected to the via posts 17 out of the aforementioned Cu wirings 16. After the resist pattern is formed, the openings are filled with Cu by the plating method.

Subsequently, the resist pattern is removed by ashing, and the Cu via posts 17 are formed.

Thereafter, by removing the Cu layer 15 and the Cr layer 14 which remain between the Cu wirings 16 by etching, the wiring pattern 18 having the Cu wirings 16 and the Cu via posts 17 is formed. At this time, an outermost trace of the wiring pattern 18 formed on the supporting base 11 is formed approximately 5 mm inside from an edge portion of the supporting base 11.

Subsequently, as shown in FIG. 7G, an insulating layer 19 which covers the wiring pattern 18 is formed.

With an insulating material, for example, non-photosensitive polyimide as a material for the insulating layer, the insulating layer 19 which covers the wiring pattern 18 and the Cu via posts 17 is formed by a CVD method or the like.

Then, as shown in FIG. 8A, a wiring layer 20 is formed with the wiring pattern 18 being embedded in the insulating layer 19 and top surfaces of the Cu via posts 17 being exposed therefrom.

It is formed by subjecting the insulating layer 19 to cutting/planarization using a tool. The aforementioned cutting apparatus shown in FIG. 9 is used as a cutting apparatus.

More specifically, cutting is performed using the tool 10 in such a manner that upper end surfaces of the Cu via posts 17 in the wiring pattern 18 and the surface of the insulating layer 19 become continuously flat.

As a result, the wiring layer 20 is formed with the wiring pattern 18 being embedded in the insulating layer 19 and the upper end surfaces of the Cu via posts 17 are exposed from the surface of the insulating layer 19. At this time, plural Cu via posts 17 are formed to have the same height as each other.

Then, as shown in FIG. 8B, the wiring structure 23 is formed by staking required plural wiring layers on the wiring layer 20.

Namely, the wirings 16 and the Cu via posts 17 are formed in the same manner as in FIG. 7F so as to be partially connected to the upper surfaces of the Cu via posts 17 exposed from the wiring layer 20, subsequently the insulating layer 19 is formed in the same manner as in FIG. 7G, and the surfaces of the insulating layer 19 and the wiring pattern 18 are planarized by cutting in the same manner as in FIG. 8A to form an upper wiring layer.

By repeating this series of steps in FIG. 7F, FIG. 7G, and FIG. 8A, plural, in the example shown, four wiring layers 20 (Note that the wiring pattern in the uppermost layer includes only the wirings 16) are formed.

Through the aforementioned steps, the multilayer (here, four-layer) wiring structure 23 formed by stacking the wiring layers 20 whose surfaces are planarized is formed.

Then, a Ti layer 25 which functions as a barrier layer when the second adhesive layer 13 is subjected to etching is formed to have a thickness of approximately 100 nm on the surface of the multilayer wiring structure 23 by the sputtering method.

Thereafter, as shown in FIG. 8C and FIG. 8D, cuts 24 which reach the second adhesive layer 13 are formed between adjacent chip regions 23a so as to demarcate the chip regions 23a.

These cuts can be formed by the dicing blade as in the first embodiment. Incidentally, FIG. 8C shows only the supporting base 11 and the wiring structure 23 for convenience of illustration. FIG. 8D and FIG. 8E each show, in an enlarged form, the construction of the supporting base 11 in both end portions (in circles) shown in FIG. 8C, but the following explanation will be particularly directed to the construction thereof in a left end portion.

Subsequently, as shown in FIG. 8D, the second adhesive layer 13 in the predetermined portion (the portion where the first adhesive layer is formed) is removed by cutting.

Here, the second adhesive layer 13 has different thicknesses at their left and right ends, and therefore the second removal method explained using FIG. 6A to FIG. 6C is used so that part of a lower layer of the second adhesive layer 13 remains. As shown in FIG. 8D, in the aforementioned predetermined portion, that is, a peripheral edge portion (both end portions in the example shown) of a formation shown in FIG. 8C, the wiring structure 23 and the second adhesive layer 13 are subjected to cutting with the tool.

Here, cutting is performed (to a depth of approximately 5 μm from the surface of the Ti layer 25) in such a manner that part of the lower layer of the second adhesive layer 13 remains (with a thickness of approximately 3 mm from an end portion of the supporting base 11) wider than the first adhesive layer 12. If the supporting base 11 is a silicon wafer and the outer edge thereof has a nearly circular shape, cutting is suitable for the removal of the predetermined portion, but if the supporting base has a rectangular shape, it may be processed using the dicing blade in the same manner as the formation of the dicing lines 24.

Incidentally, the sequence of the dicing step shown in FIG. 8C and the cutting step shown in FIG. 8D may be altered.

Thereafter, as shown in FIG. 8E, a formation in which the wiring structure 23 and the second adhesive layer 13 are integrated is separated from the supporting base 11.

Here, the second removal method shown in FIG. 6A to FIG. 6C (wet etching in FIG. 6C) is used.

More specifically, the entire formation in FIG. 8D is immersed in an etching solution to thereby dissolve the second adhesive layer 13 by wet etching. The etching solution used here is an etching solution for Cu as the material for the second adhesive layer 13, for example, a ferric chloride 30° Be' solution.

Since the second adhesive layer 13 has high adhesion to the wiring structure 23 but low adhesion to the supporting base 11, the wiring structure 23 is separated integrally with the second adhesive layer 13 from the supporting base 11 without receiving damage caused by being stripped from the supporting base 11 or a bad influence such as degeneration caused by being brought into contact with (being immersed in) the etching solution.

After the aforementioned separation step, the second adhesive layer 13 is removed from the wiring structure 23.

As shown in FIG. 8F, the second adhesive layer 13 on a lower surface of the wiring structure 23 is removed by dissolution by wet etching. An etching solution used here needs to dissolve only the second adhesive layer 13 without dissolving the wiring structure 23.

Therefore, as the etching solution, the etching solution such as the ferric chloride 30° Be' solution for the second adhesive layer 13 is used as in FIG. 8E. On this occasion, the dicing lines 24 are formed between the respective chip regions 23a of the wiring structure 23, whereby individual chip-shaped wiring substrates 26 are formed after the second adhesive layer 13 is removed by dissolution.

Then, a lower surface of each of the wiring substrates 26, the Cr layer 14 on the lower surface, and the Ti layer 25 are removed by wet etching. Incidentally, the supporting base 11 can be used again as the supporting base 11 by removing the first adhesive layer 12 remaining on its front surface by wet etching or the like (not shown).

As described above, according to this embodiment, it is possible to realize easy and certain separation of the wiring structure 23 from the supporting base 11 not only without causing damage and degeneration to the wiring structure 6 but also inexpensively and without nearly generating unnecessary dust.

In this embodiment, in order to reduce/eliminate the influence of the TTV of the supporting base when the wiring substrate is formed, the second adhesive layer 13 provided on the front surface of the supporting base 11 is subjected to cutting with the back surface of the supporting base 11 as a reference and thereby planarized.

By this cutting/planarization processing, the TTV of the supporting base 11 is mitigated/accommodated by the second adhesive layer 13, so that the wiring substrate 26 including the scaled-down Cu wirings 16 in the insulating layer 19 is manufactured at low cost while having high accuracy without receiving the influence of the TTV existing in the supporting base 11.

Incidentally, it is thought that a combination of silicon as a material for the supporting base 11, Ti as a material for the first adhesive layer 12, Cu as a material for the second adhesive layer 13, Cr as a material for the barrier layer (in this embodiment, it is expressed as the Cr layer 14), Cu as a material for the wiring pattern 18 is the most desirable as respective materials for the supporting base 11, the first adhesive layer 12, the second adhesive layer 13, the barrier layer, and the wiring pattern 18 of the wiring structure 23. By performing the respective steps in FIG. 7A to FIG. 7G and FIG. 8A to FIG. 8F based on this combination, the effect of this embodiment described above can be obtained most certainly.

Incidentally, the wiring substrates 8 and 26 manufactured by the first and second embodiments are used, for example, as an interposer in a SiP.

Figure 10:
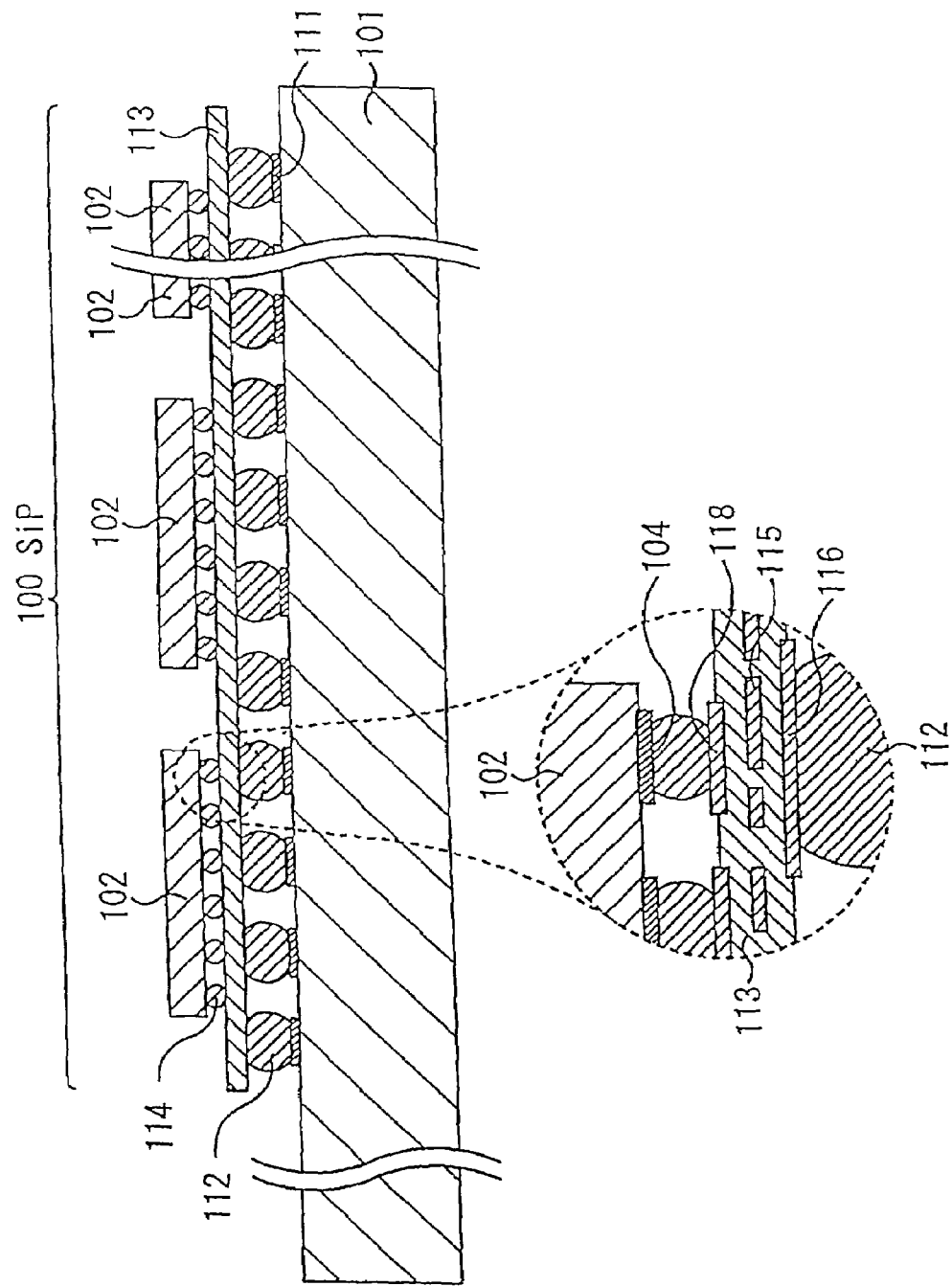
FIG. 10 is a schematic sectional view showing an example when the wiring substrate manufactured by the manufacturing method of the present invention is used as an interposer.

As shown in FIG. 10, in a SiP 100, plural (three in the example shown) semiconductor chips 102 are mounted on a supporting substrate 101 with a wiring substrate (film interposer) 113 therebetween, and the semiconductor chips 102 are electrically connected to each other via a multilayer wiring layer 115 in the wiring substrate 113.

The supporting substrate 101 is a substrate which corresponds to a so-called motherboard in an electronic device.

The wiring substrate 113 is connected/fixed to a substrate electrode 111 provided on one principal surface (an upper surface in the state shown) of the supporting substrate 101 in a terminal portion 116 provided on its one principal surface (a lower surface in the state shown) via a semiconductor ball or a semiconductor bump 112.

The semiconductor chip 102 is connected/fixed to a terminal portion 118 provided on the other principal surface (an upper surface in the state shown) of the wiring substrate 113 by a semiconductor bump 114 provided on an electrode 104 on its surface.

In the above configuration, the terminal portions provided on front and back surfaces of the wiring substrate 113 have very different densities/pitches from each other, but the cutting method according to the present invention makes it possible to accurately provide the terminal portions irrespective of the aforementioned difference in density/pitch.

Moreover, the wiring substrate 113 can be manufactured with a thin thickness and high reliability although it includes the multilayer wiring layer therein, whereby by using this wiring substrate as the aforementioned interposer, an SiP which can be manufactured easily and has a high function can be realized inexpensively.

According to the present invention, in a manufacturing method of a wiring substrate, it becomes possible to provide a manufacturing method capable of easily separating the wiring substrate from a supporting base without causing damage and degeneration to the wiring substrate and further without generating dust.

Further, since no dust is generated, it becomes possible to manufacture a thin wiring substrate containing scaled-down wirings in an insulating layer at low cost.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A manufacturing method of a wiring substrate, comprising the steps of:
    forming a first adhesive layer having adhesion to a supporting base in a predetermined portion on one principal surface of the supporting base;
    forming a second adhesive layer covering the first adhesive layer and having lower adhesion to the supporting base than the first adhesive layer on the supporting base;
    forming a wiring structure on the second adhesive layer;
    separating the first adhesive layer and the second adhesive layer in the predetermined portion; and
    separating the remaining second adhesive layer and the wiring structure from the supporting base.

2. The manufacturing method of the wiring substrate according to claim 1, further comprising, after said step of separating the second adhesive layer and the wiring structure as one piece from the supporting base, the step of removing the second adhesive layer from the wiring structure.

3. The manufacturing method of the wiring substrate according to claim 1, wherein the predetermined portion in which the first adhesive layer is formed is at least a peripheral edge portion of the supporting base.

4. The manufacturing method of the wiring substrate according to claim 1, wherein
    said step of separating the first adhesive layer and the second adhesive layer in the predetermined portion comprises the steps of:
    removing the wiring structure and the second adhesive layer in the predetermined portion; and
    removing the first adhesive layer.

5. The manufacturing method of the wiring substrate according to claim 4, wherein in said step of removing the first adhesive layer, processing is performed in such a manner that the first adhesive layer is removed by dissolution.

6. The manufacturing method of the wiring substrate according to claim 1, wherein
    said step of separating the first adhesive layer and the second adhesive layer in the predetermined portion comprises the steps of:
    removing the wiring structure and part of the second adhesive layer in the predetermined portion; and
    removing the second adhesive layer remaining in the predetermined portion.

7. The manufacturing method of the wiring substrate according to claim 6, wherein in said step of removing the second adhesive layer, processing is performed in such a manner that the second adhesive layer is removed by dissolution.

8. The manufacturing method of the wiring substrate according to claim 7, wherein a solvent used for the removal by dissolution has a property of not dissolving the wiring structure.

9. The manufacturing method of the wiring substrate according to claim 1, wherein before the first adhesive layer and the second adhesive layer are separated in the predetermined portion, cuts which demarcate respective chip structures are formed in the wiring structure to a depth reaching an upper portion of the second adhesive layer.

10. The manufacturing method of the wiring substrate according to claim 1, further comprising, after said step of forming the second adhesive layer, the step of planarizing a surface of the formed second adhesive layer with an other principal surface of the supporting base.

11. The manufacturing method of the wiring substrate according to claim 10, wherein in said step of forming the second adhesive layer, the second adhesive layer is formed to have a thickness equal to or more than a total thickness variation (TTV) of the supporting base.

12. The manufacturing method of the wiring substrate according to claim 10, wherein in said step of planarizing a surface of the second adhesive layer, processing is performed in such a manner that the surface of the second adhesive layer become flat by cutting with a tool.

13. The manufacturing method of the wiring substrate according to claim 12, wherein in said step of forming the wiring structure which is made by forming a wiring construction in an insulating layer, processing is performed in such a manner that a surface of the wiring construction and a surface of the insulating layer become continuously flat by cutting with a tool.

14. The manufacturing method of the wiring substrate according to claim 1, wherein in said step of forming the wiring structure which is made by forming a wiring construction in an insulating layer, when the wiring construction is formed by a multilayer construction in which plural wiring layers each obtained by forming respective wirings in the insulating layer are stacked, the respective wiring layers are formed by performing processing in such a manner that surfaces of the wirings and a surface of the insulating layer become continuously flat by cutting with a tool.

15. The manufacturing method of the wiring substrate according to claim 1, wherein the supporting base is one selected from a semiconductor substrate, a glass substrate, and a ceramic substrate.

16. The manufacturing method of the wiring substrate according to claim 1, wherein as a material for the first adhesive layer, at least one kind selected from the group consisting of Cr and Ti is used.

17. The manufacturing method of the wiring substrate according to claim 1, wherein as a material for the second adhesive layer, at least one kind selected from the group consisting of Ni, Cu, and Al is used.

18. The manufacturing method of the wiring substrate according to claim 1, wherein the wiring structure is formed by staking plural wiring layers.

* * * * *